(12) United States Patent
Chen

(10) Patent No.: US 12,727,143 B2
(45) Date of Patent: Sep. 1, 2026

(54) THREE-DIMENSIONAL DYNAMIC RANDOM ACCESS MEMORY

(71) Applicant: Winbond Electronics Corp., Taichung City (TW)

(72) Inventor: Frederick Chen, Tainan (TW)

(73) Assignee: Winbond Electronics Corp., Taichung City (TW)

( * ) Notice: Subject to any disclaimer, the term of this patent is extended or adjusted under 35 U.S.C. 154(b) by 339 days.

(21) Appl. No.: 18/635,044

(22) Filed: Apr. 15, 2024

(65) Prior Publication Data

US 2025/0324563 A1 Oct. 16, 2025

(51) Int. Cl.
*H10B 12/00* (2023.01)
*G11C 5/02* (2006.01)

(52) U.S. Cl.
CPC ............... *H10B 12/00* (2023.02); *G11C 5/02* (2013.01); *G11C 5/025* (2013.01); *H10B 12/02* (2023.02); *H10B 12/03* (2023.02)

(58) Field of Classification Search
CPC .................. H10B 12/02–056; G11C 5/02–025
See application file for complete search history.

(56) References Cited

U.S. PATENT DOCUMENTS

2022/0320103 A1 10/2022 Lee et al.
2022/0399490 A1 12/2022 Chen

FOREIGN PATENT DOCUMENTS

WO 2022261827 12/2022
WO 2023077314 5/2023

*Primary Examiner* — Amar Movva
(74) *Attorney, Agent, or Firm* — JCIPRNET

(57) ABSTRACT

A DRAM is provided. In the DRAM, on a substrate, first and second channel layers are separated in a first direction. A storage node is disposed between the first and second channel layers. A bit line is disposed at one side of the first channel layer away from the storage node. A word line and a first conductive are respectively disposed at opposite sides of the first channel layer in a second direction. A first dielectric layer is disposed between the word line and the first channel layer. A second dielectric layer is disposed between the storage node and the second channel layer. A second conductive is disposed at one side of the second channel layer away from the storage node. A source line and a drain line are respectively disposed at opposite sides of the second channel layer in the second direction.

20 Claims, 10 Drawing Sheets

THREE-DIMENSIONAL DYNAMIC RANDOM ACCESS MEMORY

BACKGROUND

Technical Field

The disclosure relates to a memory, and in particular relates to a three-dimensional (3D) dynamic random access memory (DRAM).

Description of Related Art

As technology advances, in order to meet consumer demand for compact electronic devices, the size of the DRAM continues to shrink, moving towards high-density development. For the DRAM includes 1 transistor and 1 capacitor (1T1C), size reduction is even more difficult. Therefore, the 3D DRAM is proposed. However, the general DRAM is still constrained by the high aspect ratio of the capacitor.

SUMMARY

A DRAM, in which a memory cell includes two transistors, and one of the transistors serves as a capacitor, are provided in the disclosure.

The DRAM of the disclosure includes a first channel, a second channel, a storage node, a bit line, a word line, a first conductive line, a first dielectric layer, a second dielectric layer, a second conductive line, a source line, and a drain line. The first channel layer and the second channel layer are disposed on a substrate and separated from each other in a first direction. The storage node is disposed on the substrate between the first channel and the second channel, and is electrically connected to the first channel layer. The bit line is disposed on the substrate at a side of the first channel away from the storage node, and is electrically connected to the first channel. The word line and the first conductive line are respectively disposed on the substrate at opposite sides of the first channel in a second direction intersecting with the first direction, in which the first conductive line is electrically connected to the first channel. The first dielectric layer is disposed between the word line and the first channel. The second dielectric layer is disposed between the storage node and the second channel. The second conductive line is disposed on the substrate at a side of the second channel away from the storage node, and is electrically connected to the second channel. The source line and the drain line are respectively disposed on the substrate at opposite sides of the second channel in the second direction, in which the source line and the drain line are respectively electrically connected to the second channel.

The DRAM of the disclosure includes a first stacked structure, a second stacked structure, multiple storage nodes, a bit line, a first conductive line, multiple word lines, a first dielectric layer, a second dielectric layer, a second conductive line, a source line, and a drain line. The first stacked structure is disposed on a substrate and includes multiple first channel and multiple first insulating layers that are alternately stacked. The second stacked structure is disposed on the substrate at one side of the first stacked structure in a first direction, and includes multiple second channels and multiple second insulating layers that are alternately stacked. The first insulating layers and the second insulating layers located at a same horizontal level are connected together. The storage nodes are respectively disposed between the first channels and the second channels located at the same horizontal level, and are electrically connected to the corresponding first channels. The bit line is disposed on the substrate at a side of the first stacked structure away from the storage node, and is electrically connected to each of the first channel layers. The first conductive line and the word lines are respectively disposed on the substrate at opposite sides of the first stacked structure in a second direction intersecting with the first direction. The first conductive line is electrically connected to each of the first channels, and each of the word lines and the corresponding first channels are located at the same horizontal level. The first dielectric layer is disposed between each of the word lines and the corresponding first channels. The second dielectric layer is disposed between each of the storage nodes and the corresponding second channels. The second conductive line is disposed on the substrate at a side of the second stacked structure away from the storage nodes, and is electrically connected to each of the second channels. The source line and the drain line are respectively disposed on the substrate at opposite sides of the second stacked structure in the second direction, in which the source line and the drain line are respectively electrically connected to each of the second channels.

To sum up, the memory cell of the DRAM of the disclosure includes two transistors, and one of the transistors serves as a capacitor. Therefore, the memory cell does not need to include a high dielectric constant (high-k) capacitor. In addition, during the operation of the DRAM formed of stacked memory cells, it is not necessary to select the memory cell to be operated through a select transistor. In addition, the above two transistors are each electrically connected to a conductive line, so the floating body effect may be effectively eliminated.

DETAILED DESCRIPTION OF DISCLOSED EMBODIMENTS

Figure 1:
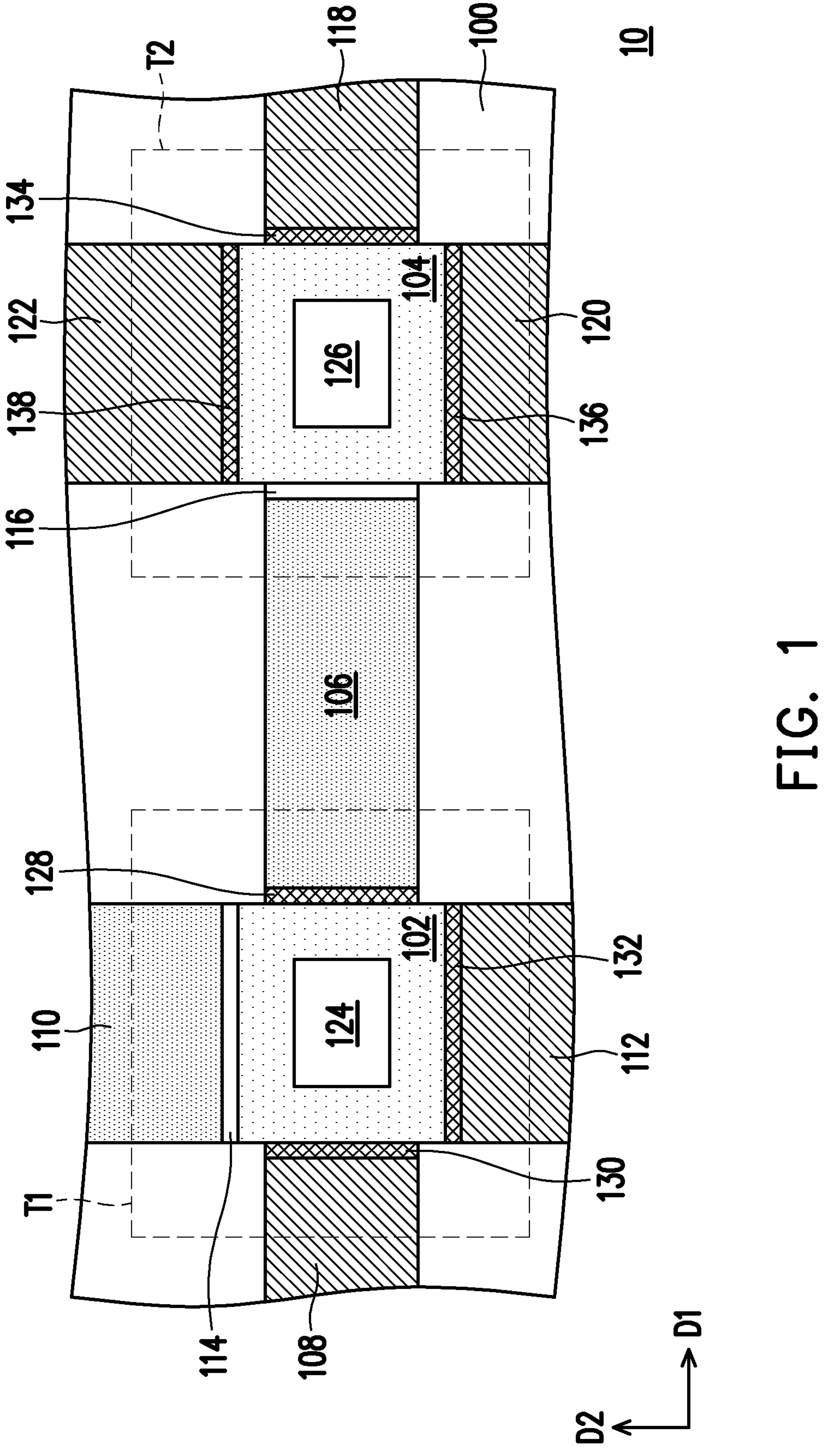
FIGS. 1, 2A and 4A are top schematic diagrams of a DRAM of different embodiments of the disclosure.

FIG. 1 is a top view schematic diagram of a DRAM of the first embodiment of the disclosure. The DRAM of this embodiment includes two transistors, and one of the transistors is used as a capacitor. Furthermore, in this embodiment, the gate of a transistor serving as a capacitor is coupled to the source of another transistor. the storage node may serve as the source of one transistor and the gate of another transistor. In addition, each of the above two transistors is electrically connected to a conductive line to eliminate the floating body effect. The DRAM of this embodiment is described in detail below.

Referring to FIG. 1, the DRAM 10 of the disclosure includes a first channel 102, a second channel 104, a storage node 106, a bit line 108, a word line 110, a first conductive line 112, a first dielectric layer 114, a second dielectric layer

116, a second conductive line 118, a source line 120, and a drain line 122, disposed on the substrate 100.

In this embodiment, the substrate 100 is a dielectric substrate, which may be a dielectric layer formed on a silicon substrate, but the disclosure is not limited thereto. The first channel 102 and the second channel 104 are disposed on the substrate 100 and are separated from each other in a first direction D1 parallel to the surface of the substrate 100. the first direction D1 may be the X direction parallel to the surface of the substrate 100. the materials of the first channel 102 and the second channel 104 may be doped polysilicon, and have a first conductivity type. the first conductivity type is one of p-type and n-type, and a second conductivity type is the other one of p-type and n-type.

Furthermore, in this embodiment, an insulator 124 may be disposed in the first channel 102, and an insulator 126 may be disposed in the second channel 104. the first channel 102 surrounds the insulator 124, and the second channel 104 surrounds the insulator 126, but the disclosure is not limited thereto. the insulator 124 and the insulator 126 may be omitted depending on the actual situation.

The storage node 106 is disposed on the substrate 100 between the first channel 102 and the second channel 104 and is electrically connected to the first channel layer 102. In this embodiment, the material of the storage node 106 may be doped polysilicon, and has the first conductivity type. the contact 128 is disposed between the first channel 102 and the storage node 106. The contact 128 may be of the second conductivity type. the contact 128 may be a doped polysilicon layer disposed on the sidewall of the first channel 102, and the storage node 106 is connected to the doped polysilicon layer. In addition, the second dielectric layer 116 is disposed between the storage node 106 and the second channel 104. the second dielectric layer 116 may be an oxide layer.

The bit line 108 is disposed on the substrate 100 at a side of the first channel 102 away from the storage node 106 and is electrically connected to the first channel 102. That is, the storage node 106 and the bit line 108 are respectively located at opposite sides of the first channel 102 in the first direction D1. the material of the bit line 108 may be metal, such as tungsten. the contact 130 is disposed between the first channel 102 and the bit line 108. Like the contact 128, the contact 130 may be of the second conductivity type. the contact 130 may be a doped polysilicon layer disposed on the sidewall of the first channel 102, and the storage node 108 is connected to the doped polysilicon layer.

The word line 110 and the first conductive line 112 are respectively disposed on the substrate 100 at opposite sides of the first channel 102 in a second direction D2 intersecting with the first direction D1. In this embodiment, the second direction D2 may be the Y direction parallel to the surface of the substrate 100. the material of the word line 110 may be doped polysilicon and has the first conductivity type. The first dielectric layer 114 is disposed between the word line 110 and the first channel 102. the first dielectric layer 114 may be an oxide layer. The first conductive line 112 is electrically connected to the first channel 102. the material of the first conductive line 112 may be metal, such as tungsten. the contact 132 is disposed between the first channel 102 and the first conductive line 112. Like the contact 128, the contact 132 may be of the second conductivity type. the contact 132 may be a doped polysilicon layer disposed on the sidewall of the first channel 102, and the first conductive line 112 is connected to the doped polysilicon layer.

The second conductive line 118 is disposed on the substrate 100 at a side of the second channel 104 away from the storage node 106 and is electrically connected to the second channel 104. That is, the storage node 106 and the second conductive line 118 are respectively located at opposite sides of the second channel 104 in the first direction D1. In this embodiment, the material of the second conductive line 118 may be metal, such as tungsten. the contact 134 is disposed between the second channel 104 and the second conductive line 118. Like the contact 128, the contact 134 may be of the second conductivity type. the contact 134 may be a doped polysilicon layer disposed on the sidewall of the second channel 104, and the second conductive 118 is connected to the doped polysilicon layer.

The source line 120 and the drain line 122 are respectively disposed on the substrate 100 at opposite sides of the second channel 104 in the second direction D2. The source line 120 and the drain line 122 are respectively electrically connected to the second channel 104. In this embodiment, the material of the source line 120 and the drain line 122 may be metal, such as tungsten. Furthermore, the contact 136 is disposed between the second channel 104 and the source line 120, and the contact 138 is disposed between the second channel 104 and the drain line 122. Like the contact 128, the contact 136 and the contact 138 may be of the second conductivity type. In this embodiment, the contact 136 and the contact 138 may be doped polysilicon layers disposed on the sidewalls of the second channel 104, and the source line 120 and the drain line 122 are connected to the doped polysilicon layers.

In the DRAM 10 of this embodiment, the first channel 102, the storage node 106, the bit line 108, the word line 110, and the first dielectric layer 114 may form a transistor T1. The word line 110 may serve as a gate, the first dielectric layer 114 may serve as a gate dielectric layer, and the storage node 106 may serve as a drain. In addition, the second channel 104, the storage node 106, the second dielectric layer 116, the source line 120 and the drain line 122 may form a transistor T2. The storage node 106 may serve as a gate, and the second dielectric layer 116 may serve as a gate dielectric layer, the storage node 106 may serve as the drain of the transistor T1 and the gate of the transistor T2, and the transistor T2 may serve as the capacitor of the DRAM.

In addition, the first conductive line 112 is electrically connected to the first channel layer 102 of the transistor T1 can be connected to a ground or reference voltage, thereby eliminating the floating body effect of the transistor T1 during operation. Similarly, the second conductive line 118 is electrically connected to the second channel layer 104 of the transistor T2 can be connected to a ground or reference voltage, thereby eliminating the floating body effect of the transistor T2 during operation.

Multiple DRAMs 10 may be stacked on the substrate to form a 3D DRAM. That is, the DRAM 10 may serve as a DRAM cell in a 3D DRAM. This is explained in detail below.

Figure 2A:
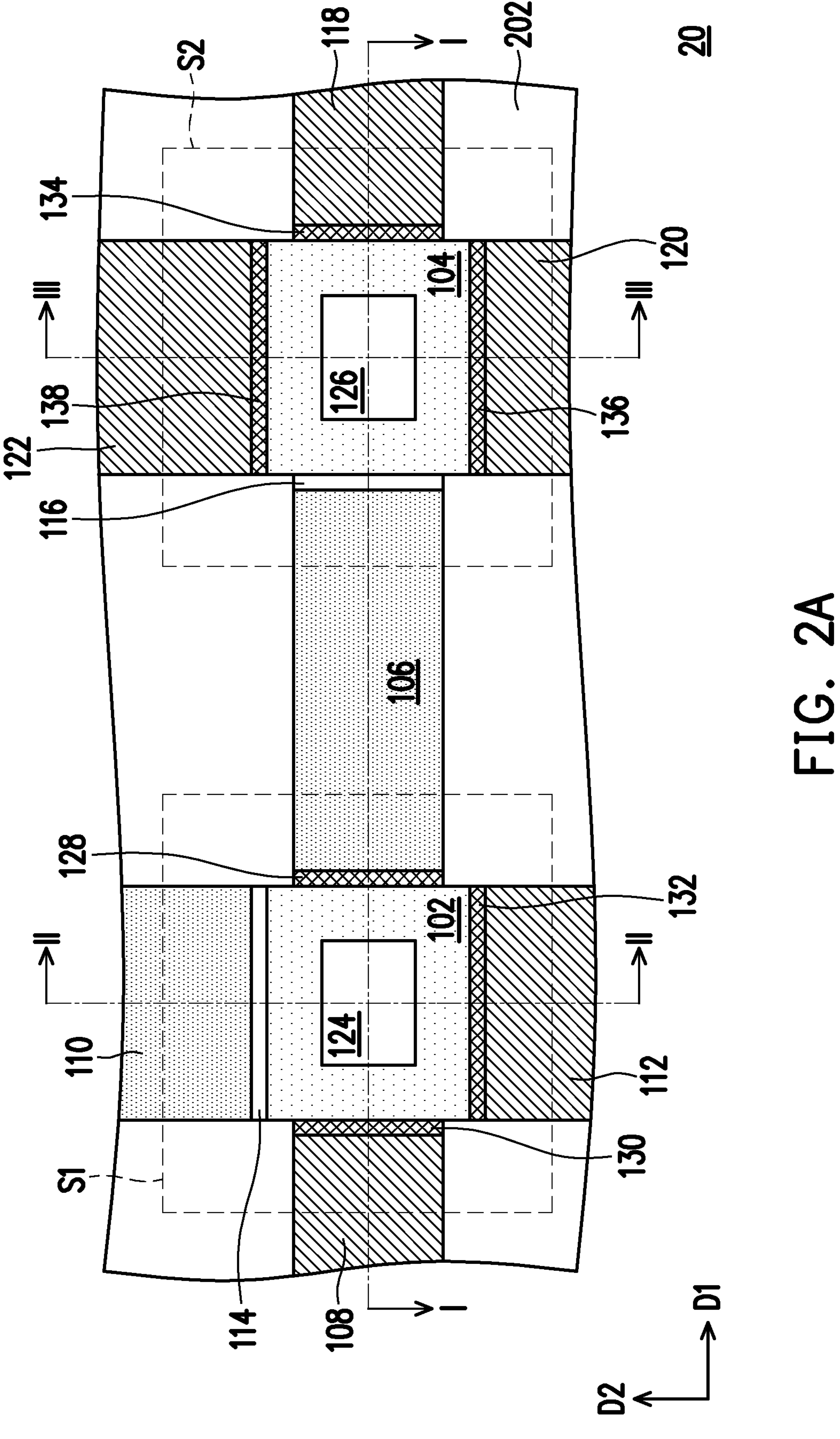
Figure 2B:
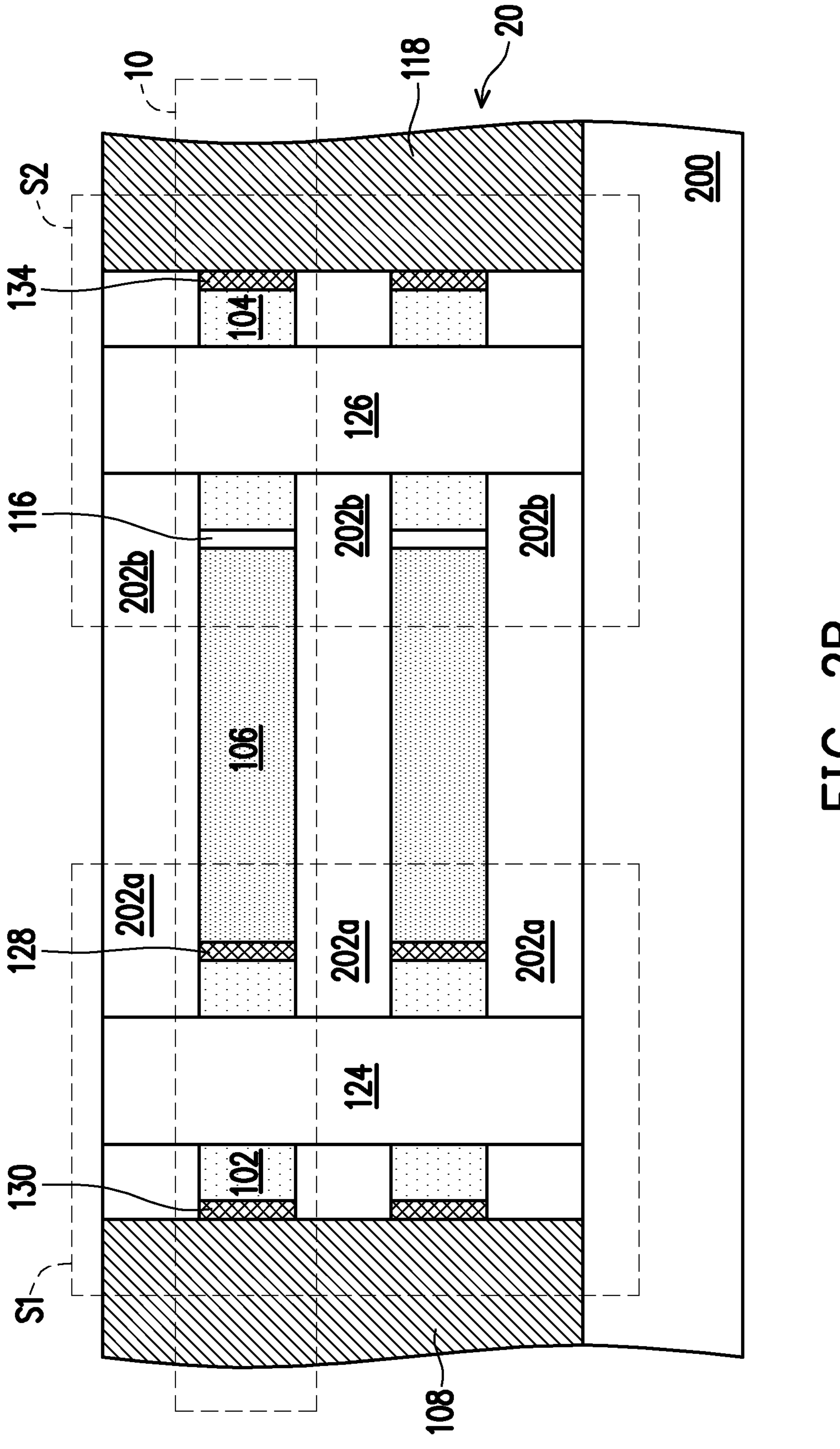
FIGS. 2B, 2C and 2D are cross-sectional schematic diagrams along line I-I, line II-II and line III-III respectively in FIG. 2A.
Figure 2C:
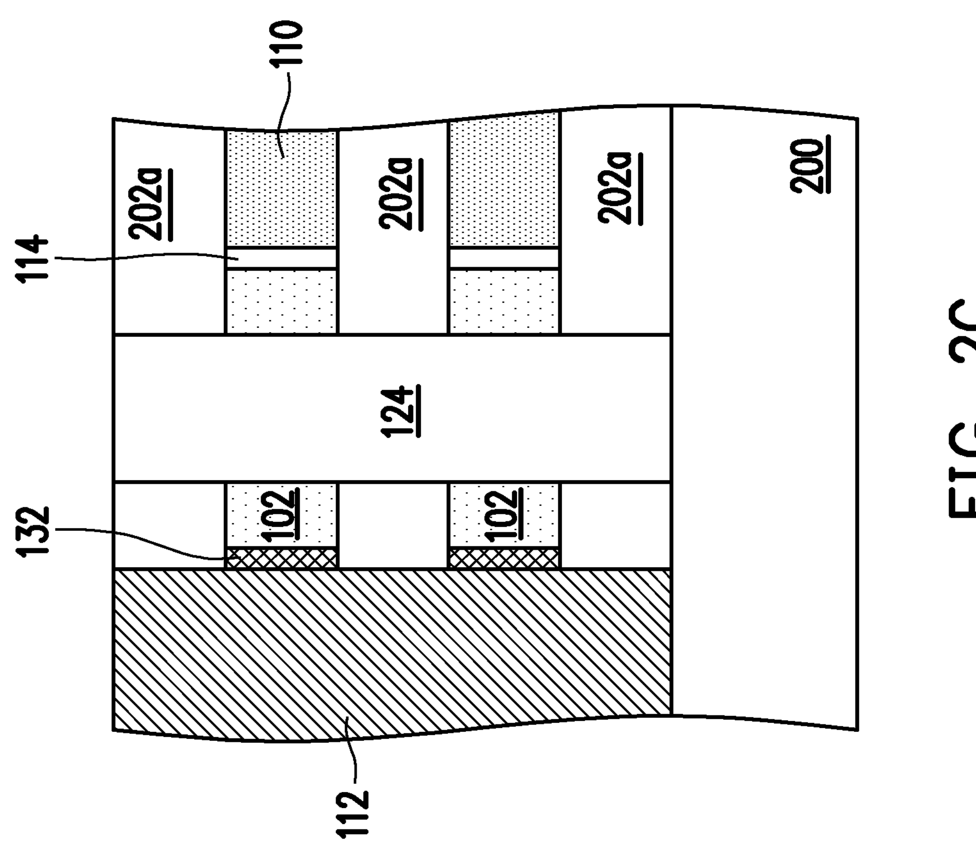
Figure 2D:
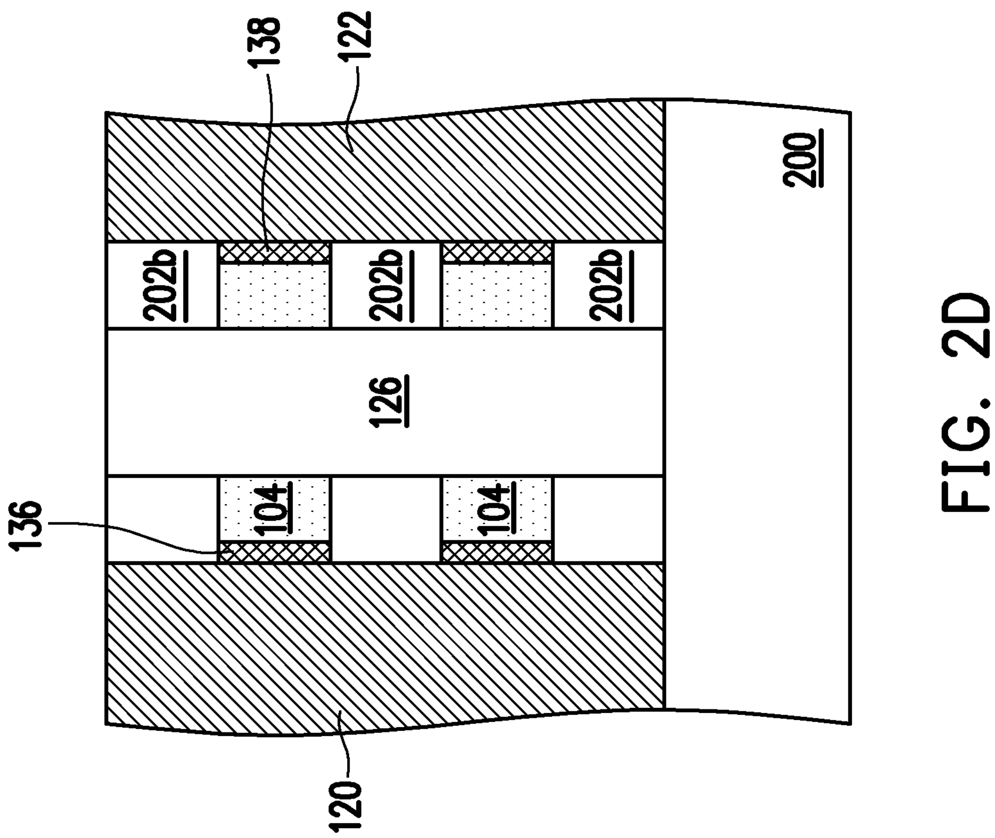

FIG. 2A is a top schematic diagram of a DRAM of the second embodiment of the disclosure. FIG. 2B is a cross-sectional schematic diagram along line I-I in FIG. 2A. FIG. 2C is a cross-sectional schematic diagram along line II-II in FIG. 2A. FIG. 2D is a cross-sectional schematic diagram along line III-III in FIG. 2A. In this embodiment, the same components as those of the first embodiment are denoted by the same reference symbols, and their description are not repeated herein. In addition, for clarity and ease of explanation, the topmost insulating layer has been omitted in FIG. 2A.

Referring to FIG. 2A, FIG. 2B, FIG. 2C, and FIG. 2D at the same time, a DRAM 20 is disposed on a substrate 200. In this embodiment, the substrate 200 is a dielectric substrate, which may be a dielectric layer formed on a silicon substrate, but the disclosure is not limited thereto. In this embodiment, the DRAM 20 is formed of multiple DRAMs 10 stacked as DRAM cells, and two adjacent DRAMs 10 are separated by an insulating layer.

In detail, in the DRAM 20, the stacked transistors T1 are separated by multiple first insulating layers 202*a*, and the first channels 102 in the transistors T1 and the first insulating layers 202*a* form a first stacked structure S1. In addition, the stacked transistors T2 are separated by multiple second insulating layers 202*b*, and the second channels 104 in the transistors T2 and the second insulating layers 202*b* form a second stacked structure S2. In addition, each first insulating layer 202*a* in the first stacked structure S1 is connected to the second insulating layer 202*b* located at the same horizontal level in the second stacked structure S2, so that each first channel 102 in the first stacked structure S1 is located at the same horizontal level as the corresponding second channel 104 in the second stacked structure S2. The first insulating layer 202*a* and the second insulating layer 202*b* located at the same horizontal level may be connected to form an integral insulating layer 202.

In addition, in the DRAM 20, the bit lines 108 in each layer are connected together vertically, the first conductive line 112, the second conductive line 118 in each layer, the source lines 120, and the drain lines 122 all conduct current vertically. The insulators 124 in each layer are connected together vertically to form an insulating pillar that penetrates through the first stacked structure S1, and the insulators 126 in each layer are connected together vertically to form an insulating pillar penetrating the second stacked structure S2.

Figure 3:
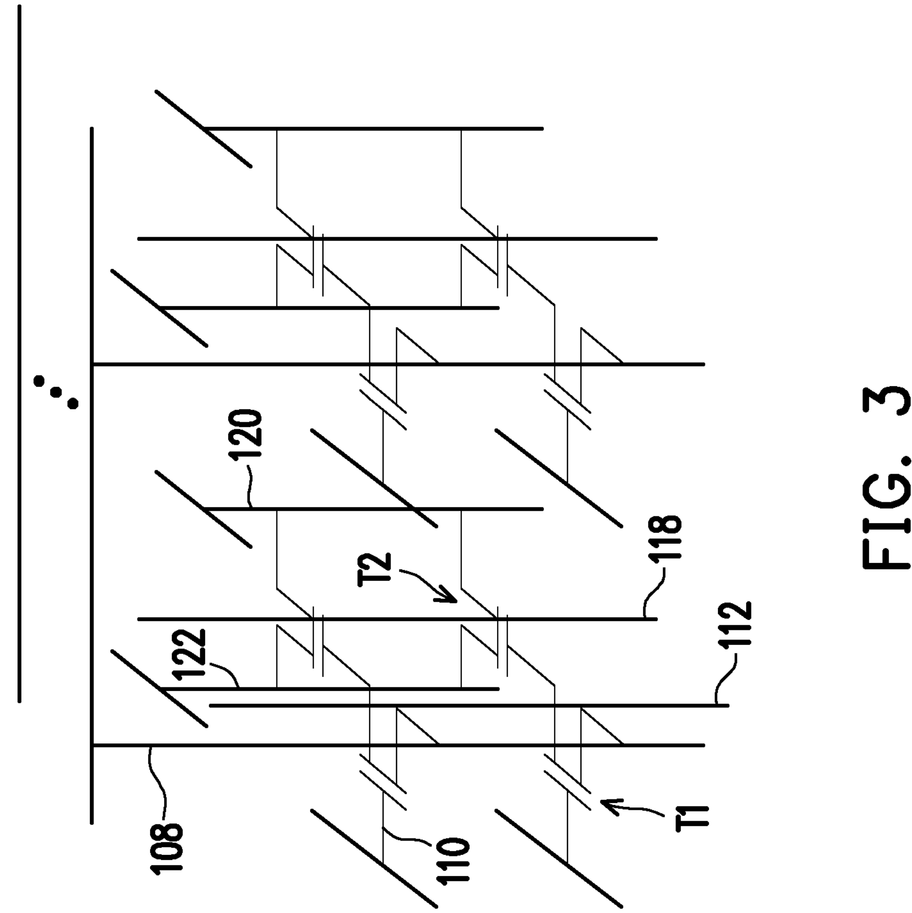
FIG. 3 is a circuit schematic diagram of the 3D DRAM of the disclosure.

Taking the 3D DRAM 20 as an example, the circuit schematic diagram of the 3D DRAM of the disclosure is shown in FIG. 3. In FIG. 3, the drains of transistors T1 located in different layers are connected through the bit line 108, the sources of transistors T2 located in different layers are connected through the source line 120, and the drains of transistors T2 located in different layers are connected through the drain line 122. In this way, during the operation, a target memory cell may be operated by respectively applying the required voltages to the bit line 108, the word line 110, the source line 120, and the drain line 122, without the need to select the memory cell to be operated by a select transistor. That is, no additional selection transistor is required in the DRAM of the disclosure. In addition, in the DRAM of the disclosure, one transistor in one memory cell may serve as a capacitor, so there is no need to provide an additional capacitor.

Figure 4A:
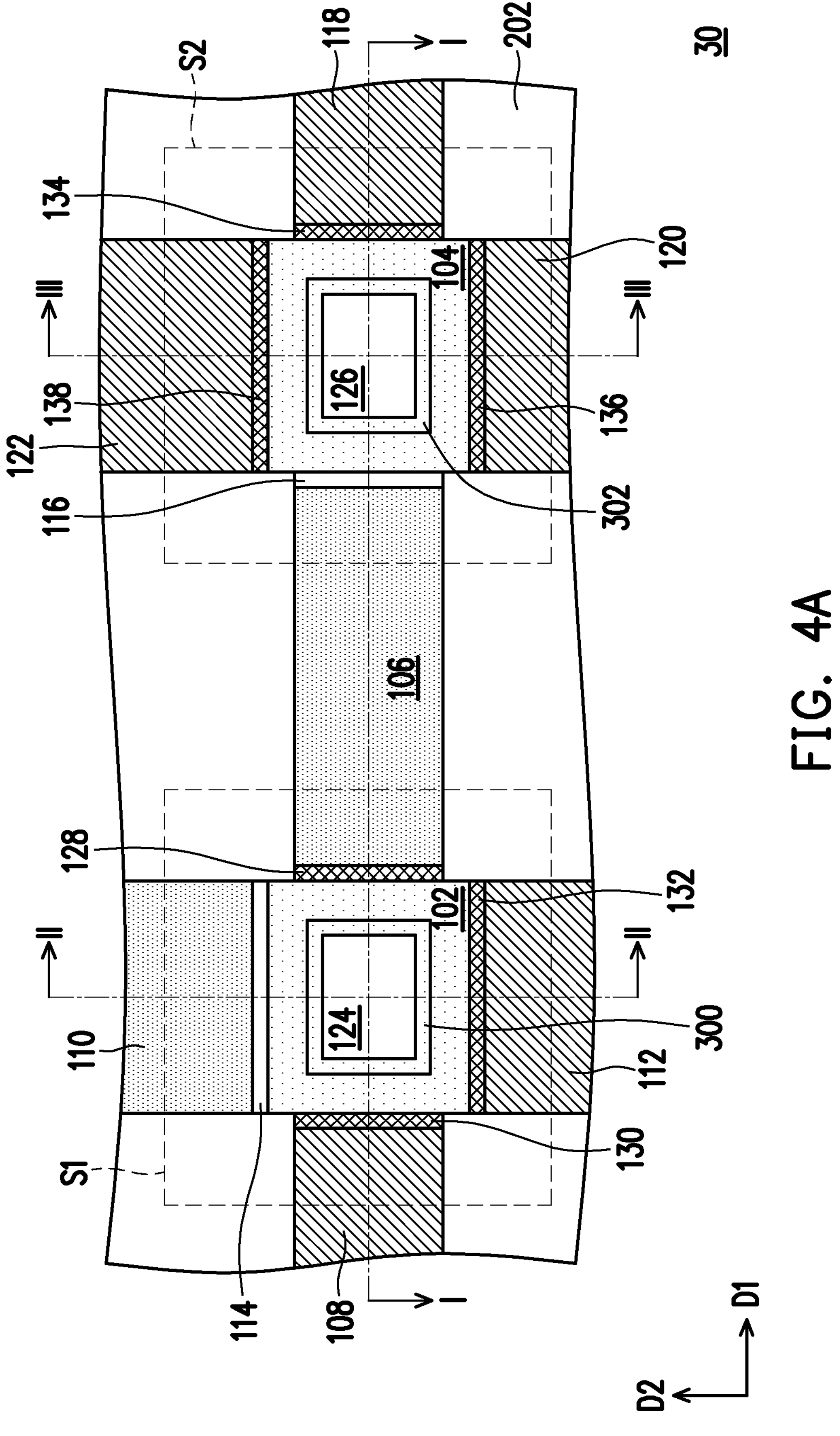
Figure 4B:
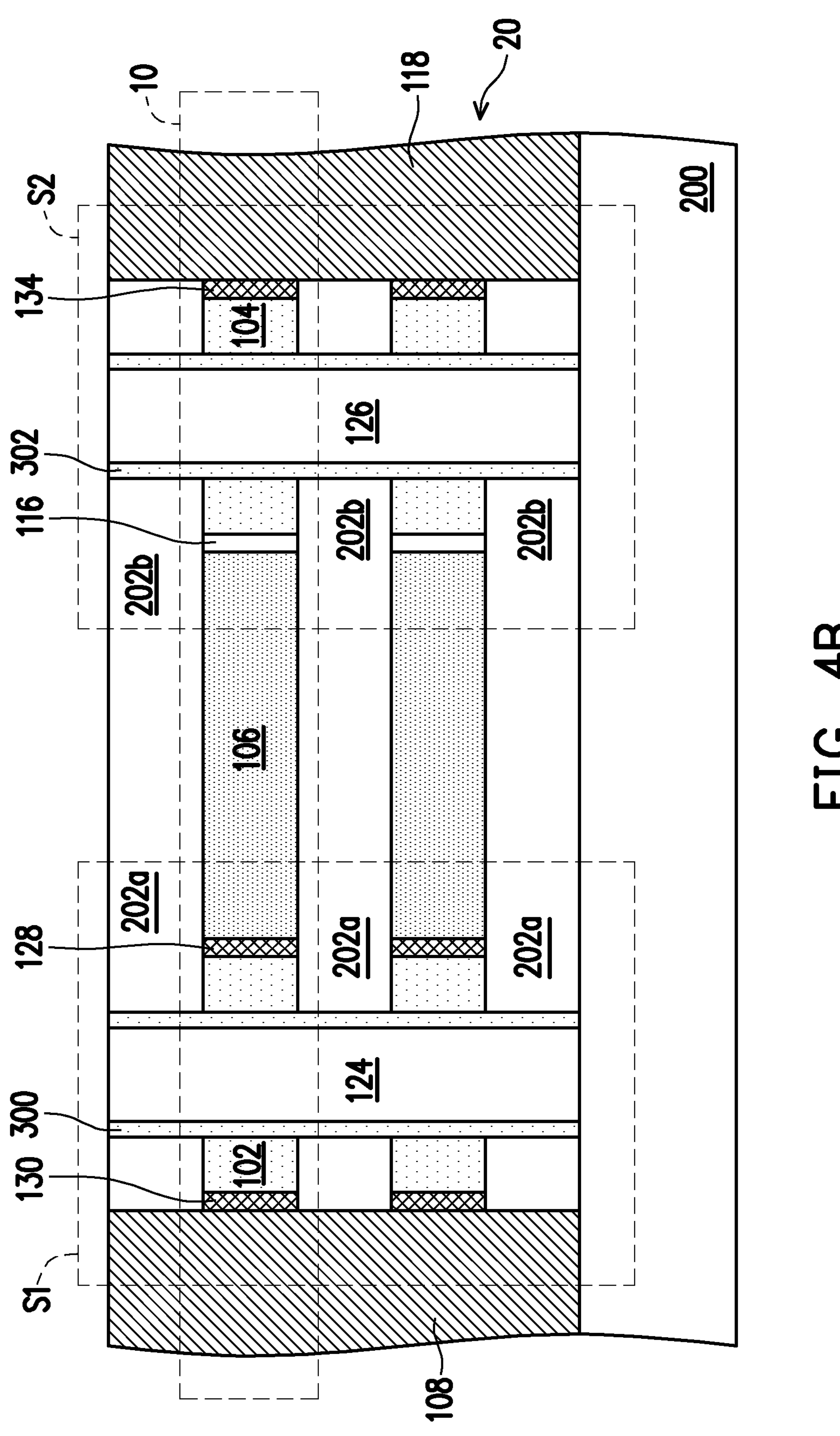
FIGS. 4B, 4C and 4D are cross-sectional schematic diagrams along line I-I, line II-II and line III-III respectively in FIG. 4A.
Figure 4C:
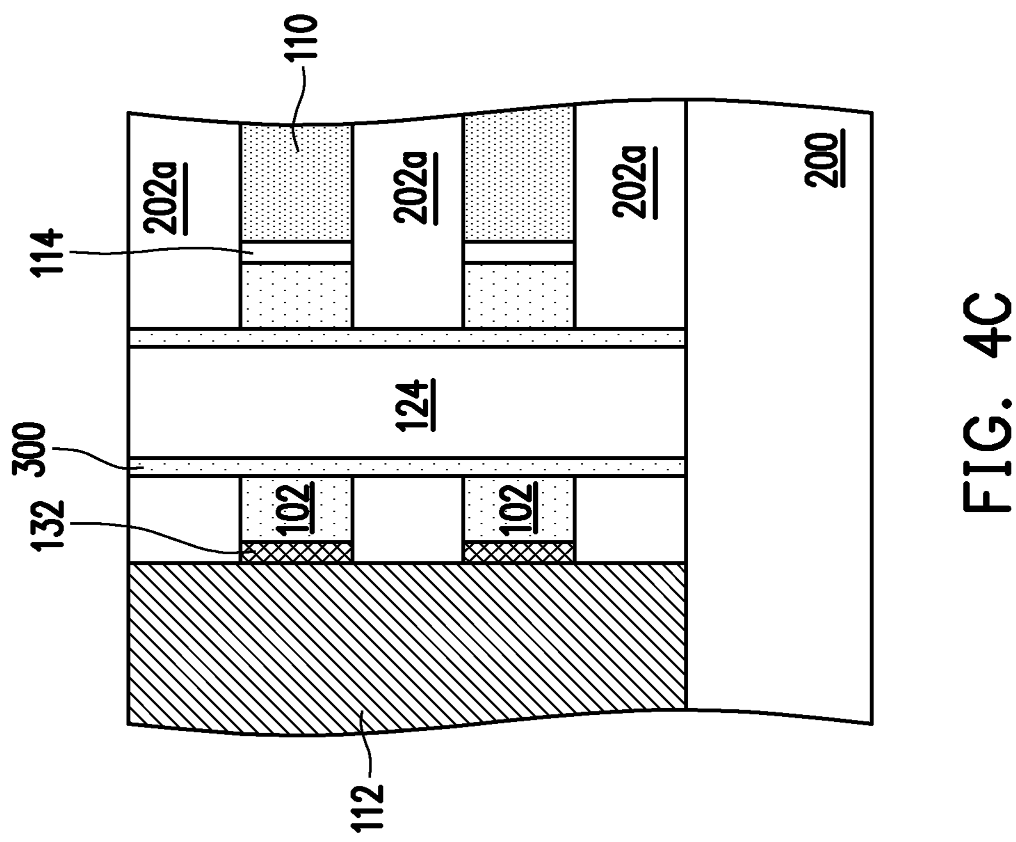
Figure 4D:
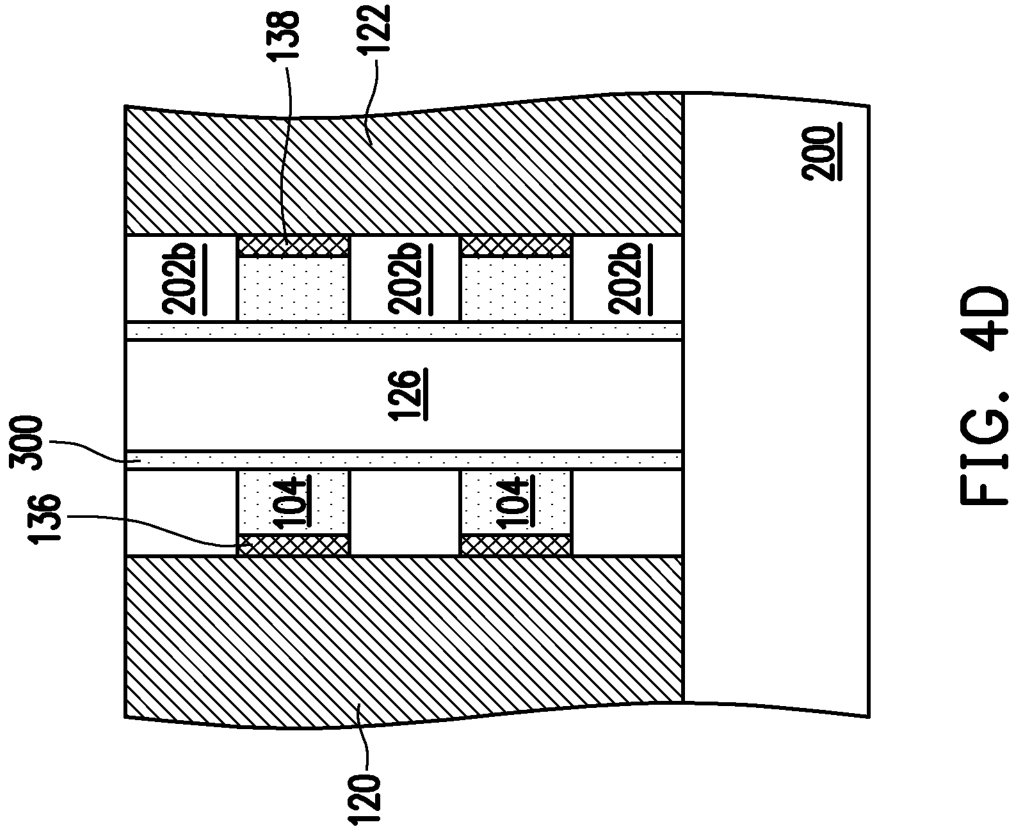

FIG. 4A is a top schematic diagram of a DRAM of the third embodiment of the disclosure. FIG. 4B is a cross-sectional schematic diagram along line I-I in FIG. 4A. FIG. 4C is a cross-sectional schematic diagram along line II-II in FIG. 4A. FIG. 4D is a cross-sectional schematic diagram along line III-III in FIG. 4A. In this embodiment, the same components as those of the second embodiment are denoted by the same reference symbols, and their description are not repeated herein. In addition, for clarity and ease of explanation, the topmost first insulating layer and the second insulating layer are omitted in FIG. 4A.

Referring to FIG. 4A, FIG. 4B, FIG. 4C and FIG. 4D at the same time, the difference between the DRAM 30 of this embodiment and the DRAM 20 is that the DRAM 30 further includes a through-layer channel 300 and a through-layer channel 302.

In detail, in this embodiment, the through-layer channel 300 is disposed between the insulating pillar formed by connecting the insulators 124 in each layer vertically and the first channel 102, and between the insulating pillar and the first insulating layer 202*a*. That is, the through-layer channel 300 surrounds the insulating pillar and connects the first channel 102 in each layer together. In this embodiment, the material of the through-layer channel 300 is the same as the material of the first channel 102, so that the channel 300 may be connected with the first channel 102 in each layer.

In detail, in this embodiment, the through-layer channel 302 is disposed between the insulating pillar formed by connecting the insulators 126 in each layer vertically and the second channel 104, and between the insulating pillar and the second insulating layer 202*b*. That is, the through-layer channel 302 surrounds the insulating pillar and connects the second channel 104 in each layer together. In this embodiment, the material of the through-layer channel 302 is the same as the material of the second channel 104, so that the channel 302 may be connected with the second channel 104 in each layer.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A dynamic random access memory, comprising:

a first channel and a second channel, disposed on a substrate and separated from each other in a first direction;

a storage node, disposed on the substrate between the first channel and the second channel, and electrically connected to the first channel;

a bit line, disposed on the substrate at a side of the first channel away from the storage node, and electrically connected to the first channel;

a word line and a first conductive line, respectively disposed on the substrate at opposite sides of the first channel in a second direction intersecting with the first direction, wherein the first conductive line is electrically connected to the first channel;

a first dielectric layer, disposed between the word line and the first channel;

a second dielectric layer, disposed between the storage node and the second channel;

a second conductive line, disposed on the substrate at a side of the second channel away from the storage node, and electrically connected to the second channel; and a source line and a drain line, respectively disposed on the substrate at opposite sides of the second channel in the second direction, wherein the source line and the drain line are respectively electrically connected to the second channel.

2. The dynamic random access memory according to claim 1, further comprising a contact disposed between the first channel and the bit line.

3. The dynamic random access memory according to claim 1, further comprising a contact disposed between the first channel and the storage node.

4. The dynamic random access memory according to claim 1, further comprising a contact disposed between the first channel and the first conductive line.

5. The dynamic random access memory according to claim 1, further comprising a contact disposed between the second channel and the source line.

6. The dynamic random access memory according to claim 1, further comprising a contact disposed between the second channel and the drain line.

7. The dynamic random access memory according to claim 1, further comprising a contact disposed between the second channel and the second conductive line.

8. The dynamic random access memory according to claim 1, further comprising an insulating layer disposed in the first channel.

9. The dynamic random access memory according to claim 1, further comprising an insulating layer disposed in the second channel.

10. A dynamic random access memory, comprising:

a first stacked structure, disposed on a substrate, and comprising a plurality of first channels and a plurality of first insulating layers that are alternately stacked;

a second stacked structure, disposed on the substrate at one side of the first stacked structure in a first direction, and comprising a plurality of second channels and a plurality of second insulating layers that are alternately stacked, wherein the first insulating layer and the second insulating layer located at the same horizontal level are connected together;

a plurality of storage nodes, respectively disposed between the first channel and the second channel located at the same horizontal level, and each electrically connected to a corresponding first channel thereof;

a bit line, disposed on the substrate at a side of the first stacked structure away from the storage nodes, and electrically connected to each of the first channels;

a first conductive line and a plurality of word lines, respectively disposed on the substrate at opposite sides of the first stacked structure in a second direction intersecting with the first direction, wherein the first conductive line is electrically connected to each of the first channel, and each of the word lines and a corresponding first channel thereof are located at the same horizontal level;

a first dielectric layer, disposed between each of the word lines and the corresponding first channel thereof;

a second dielectric layer, disposed between each of the storage nodes and the corresponding second channel thereof;

a second conductive line, disposed on the substrate at a side of the second stacked structure away from the storage nodes, and electrically connected to each of the second channel; and a source line and a drain line, respectively disposed on the substrate at opposite sides of the second stacked structure in the second direction, wherein the source line and the drain line are respectively electrically connected to each of the second channels.

11. The dynamic random access memory according to claim 10, further comprising a contact disposed between each of the first channels and the bit line.

12. The dynamic random access memory according to claim 10, further comprising a contact disposed between each of the first channels and a corresponding storage node thereof.

13. The dynamic random access memory according to claim 10, further comprising a contact disposed between each of the first channels and the first conductive line.

14. The dynamic random access memory according to claim 10, further comprising a contact disposed between each of the second channels and the source line.

15. The dynamic random access memory according to claim 10, further comprising a contact disposed between each of the second channels and the drain line.

16. The dynamic random access memory according to claim 10, further comprising a contact disposed between each of the second channels and the second conductive line.

17. The dynamic random access memory according to claim 10, further comprising an insulating pillar penetrating the first stacked structure and located in the first channels.

18. The dynamic random access memory according to claim 17, further comprising a through-layer channel disposed between the insulating pillar and the first channels and between the insulating pillar and the first insulating layers.

19. The dynamic random access memory according to claim 10, further comprising an insulating pillar penetrating the second stacked structure and located in the second channels.

20. The dynamic random access memory according to claim 19, further comprising a through-layer channel disposed between the insulating pillar and the second channels and between the insulating pillar and the second insulating layers.

* * * * *